(12) United States Patent
Wang

(10) Patent No.: US 11,322,671 B2
(45) Date of Patent: May 3, 2022

(54) LIGHT-EMITTING DIODE, METHOD FOR MANUFACTURING THE SAME, BACKLIGHT SOURCE AND DISPLAY DEVICE FOR IMPROVING HEAT DISSIPATION

(71) Applicants: BOE OPTICAL SCIENCE AND TECHNOLOGY CO., LTD., Jiangsu (CN); BOE TECHNOLOGY GROUP CO., LTD., Beijing (CN)

(72) Inventor: Tao Wang, Beijing (CN)

(73) Assignees: BOE OPTICAL SCIENCE AND TECHNOLOGY CO., LTD., Jiangsu (CN); BOE TECHNOLOGY GROUP CO., LTD., Beijing (CN)

( * ) Notice: Subject to any disclaimer, the term of this patent is extended or adjusted under 35 U.S.C. 154(b) by 259 days.

(21) Appl. No.: 16/609,888

(22) PCT Filed: Apr. 29, 2019

(86) PCT No.: PCT/CN2019/085048
§ 371 (c)(1),
(2) Date: Oct. 31, 2019

(87) PCT Pub. No.: WO2019/214490
PCT Pub. Date: Nov. 14, 2019

(65) Prior Publication Data
US 2021/0336115 A1    Oct. 28, 2021

(30) Foreign Application Priority Data

May 10, 2018  (CN) .......................... 201820692261.8

(51) Int. Cl.
*H01L 33/64*  (2010.01)
*H01L 23/00*  (2006.01)
*H01L 33/62*  (2010.01)

(52) U.S. Cl.
CPC ............ *H01L 33/642* (2013.01); *H01L 24/29* (2013.01); *H01L 24/83* (2013.01); *H01L 33/62* (2013.01);
(Continued)

(58) Field of Classification Search
CPC .................. H01L 33/64–648; H01L 33/62
See application file for complete search history.

(56) References Cited

U.S. PATENT DOCUMENTS 7,687,823 B2 * 3/2010 Amo ..................... H01L 33/505
257/99
7,709,857 B2   5/2010 Kim et al.
(Continued)

FOREIGN PATENT DOCUMENTS

| CN | 103855286 A | 6/2014 |
|----|-------------|--------|
| CN | 104882524 A | 9/2015 |

(Continued)

*Primary Examiner* — Stephen M Bradley
(74) *Attorney, Agent, or Firm* — Nath, Goldberg & Meyer; Joshua B. Goldberg

(57) ABSTRACT

The present disclosure provides a light-emitting diode, a method for manufacturing the same, a backlight source and a display device. The light-emitting diode includes a support having a bottom wall, a light-emitting chip on the support, and a die bonding structure. A through hole is provided in the bottom wall. At least a portion of the die bonding structure is located in the through hole. The light-emitting chip is attached to the bottom wall through the die bonding structure.

14 Claims, 5 Drawing Sheets

(52) U.S. Cl.
CPC .. *H01L 33/641* (2013.01); *H01L 2224/29022* (2013.01); *H01L 2224/83192* (2013.01); *H01L 2924/12041* (2013.01); *H01L 2933/0075* (2013.01)

(56) References Cited

U.S. PATENT DOCUMENTS 8,314,346 B2 * 11/2012 Hasegawa ............ H05K 1/0206
174/260
2010/0123164 A1 * 5/2010 Suehiro .................. F21V 29/70
257/99

FOREIGN PATENT DOCUMENTS

CN 208062105 U 11/2018
JP 2008270822 A 11/2008

* cited by examiner

A-A

B-B

B-B

B-B

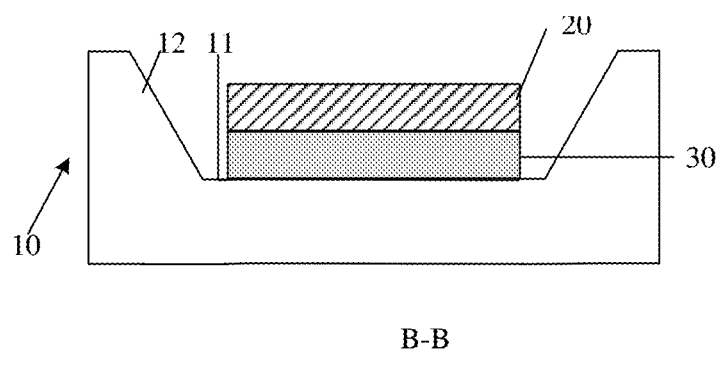
B-B
FIG.11 (--Prior Art--)

LIGHT-EMITTING DIODE, METHOD FOR MANUFACTURING THE SAME, BACKLIGHT SOURCE AND DISPLAY DEVICE FOR IMPROVING HEAT DISSIPATION

CROSS-REFERENCE TO RELATED APPLICATIONS

This is a National Phase Application filed under 35 U.S.C. 371 as a national stage of PCT/CN2019/085048, filed Apr. 29, 2019, an application claiming the benefit of Chinese Patent Application No. 201820692261.8, filed on May 10, 2018, the content of each of which is incorporated herein by reference in its entirety.

TECHNICAL FIELD

The present disclosure relates to the field of display technology, in particular, to a light-emitting diode, a method for manufacturing the light-emitting diode, a backlight source, and a display device.

BACKGROUND

Heat dissipation in light-emitting diodes (LEDs) is a very important technical problem in the industry, and the heat dissipation in the LEDs affects the service life and the light-emitting brightness of the LEDs.

SUMMARY

A light-emitting diode is provided, which includes a support having a bottom wall, a light-emitting chip on the support, and a die bonding structure. At least one through hole is provided in the bottom wall; the die bonding structure is in the at least one through hole; and the light-emitting chip is attached to the bottom wall through the die bonding structure.

In an implementation, a recess portion is provided on a side of the bottom wall distal to the light-emitting chip and is in communication with the through hole. The die bonding structure includes a first die bonding layer and a second die bonding layer. The first die bonding layer is the through hole; and the second die bonding layer is in the recess portion.

In an implementation, an orthographic projection of the recess portion on the bottom wall covers and exceeds an orthographic projection of the through hole on the bottom wall.

In an implementation, the light-emitting chip is on a surface of the first die bonding layer distal to the second die bonding layer.

In an implementation, the die bonding structure further includes a third die bonding layer on a surface of the first die bonding layer distal to the second die bonding layer; and the light-emitting chip is on a surface of the third die bonding layer distal to the first die bonding layer.

In an implementation, the at least one through hole includes a plurality of through holes; the first die bonding layer includes a plurality of die bonding portions; and the plurality of die bonding portions are in the plurality of through holes in a one-to-one correspondence manner.

In an implementation, the first die bonding layer, the second die bonding layer and the third die bonding layer are made of a same material and formed together as one piece.

In an implementation, the light-emitting diode further includes a heat dissipation layer in contact with a surface of the die bonding structure distal to the light-emitting chip.

In an implementation, the support further includes a sidewall connected with an edge of the bottom wall and surrounding the light-emitting chip. The heat dissipation layer includes a first heat dissipation portion on a surface of the second die bonding layer distal to the first die bonding layer, and a second heat dissipation portion inside the sidewall of the support.

In an implementation, the heat dissipation layer includes any one selected from metal, heat dissipation silica gel, silicon chip, graphite and ceramic.

According to an aspect of the present disclosure, a backlight source is provided which includes the light-emitting diode described above.

According to an aspect of the present disclosure, a display device is provided, which includes the backlight source described above.

According to an aspect of the present disclosure, a method for manufacturing a light-emitting diode is provided, which includes: providing a support having a bottom wall; forming at least one through hole in the bottom wall; forming at least a portion of a die bonding structure in the at least one through hole; and attaching a light-emitting chip on the bottom wall through the die bonding structure.

In an implementation, the method further includes: forming a recess portion, which is in communication with the through hole, on a side of the bottom wall distal to the light-emitting chip. Forming a die bonding structure in the at least one through hole further includes: forming a first die bonding layer of the die bonding structure in the through hole; and forming a second die bonding layer of the die bonding structure in the recess portion.

In an implementation, the forming a recess portion on a side of the bottom wall distal to the light-emitting chip further includes: forming the recess portion such that an orthographic projection of the recess portion on the bottom wall covers and exceeds an orthographic projection of the through hole on the bottom wall.

In an implementation, the attaching a light-emitting chip on the bottom wall through the die bonding structure further includes: forming the light-emitting chip on a surface of the first die bonding layer distal to the second die bonding layer.

In an implementation, forming a die bonding structure in the at least one through hole further includes: forming a third die bonding layer on a surface of the first die bonding layer distal to the second die bonding layer. Attaching a light-emitting chip on the bottom wall through the die bonding structure further includes: providing the light-emitting chip on a surface of the third die bonding layer distal to the first die bonding layer.

In an implementation, the at least one through hole includes a plurality of through holes; the first die bonding layer includes a plurality of die bonding portions; the forming at least a portion of a die bonding structure in the at least one through hole further includes: forming the plurality of die bonding portions in the plurality of through holes in a one-to-one correspondence manner.

In an implementation, the first die bonding layer, the second die bonding layer and the third die bonding layer are made of a same material and formed together as one piece.

In an implementation, the method further includes: forming a heat dissipation layer in contact with a surface of the second die bonding layer distal to the light-emitting chip.

BRIEF DESCRIPTION OF THE DRAWINGS

The accompanying drawings, which provide a further understanding of the present disclosure and constitute a part of the specification, are used in conjunction with the following specific embodiments to explain the present disclosure, but are not intended to limit the present disclosure. In the drawings:

FIG. 11 is a cross-sectional view of a structure of a light-emitting diode in the related art.

DETAILED DESCRIPTION

The embodiments of the present disclosure will be described in detail below with reference to the accompanying drawings. It is to be understood that the embodiments described herein are merely used for describing and explaining the present disclosure rather than limiting of the present disclosure.

FIG. 11 is a cross-sectional view of a structure of a light-emitting diode in the related art. As shown in FIG. 11, the light-emitting diode includes a support 10, a light-emitting chip 20 on the support 10, and a die bonding structure 30. The support 10 includes a bottom wall 11. The support may include a sidewall or may not include a sidewall. The die bonding structure 30 is disposed on the bottom wall 11 of the support 10, and the light-emitting chip 20 is disposed on the die bonding structure 30. The light-emitting chip 20 is attached to the bottom wall 11 of the support 10 through the die bonding structure 30.

In the related art, a heat dissipation structure is added inside or outside the support of the light-emitting diode so as to dissipate heat of the light-emitting diode. However, such heat dissipation methods may increase additional processes, thus result in increased production complexity and increased cost.

Figure 1:
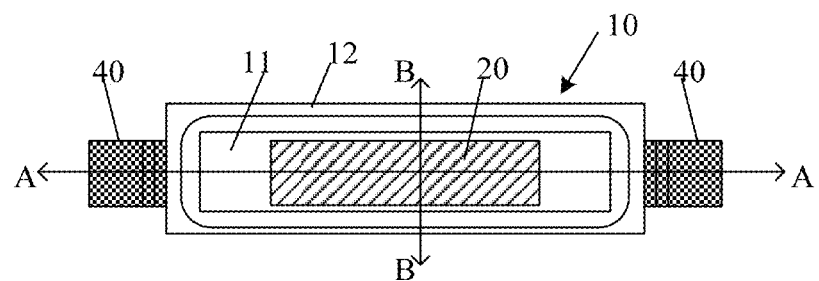
FIG. 1 is a top view of a structure of a light-emitting diode according to an embodiment of the present disclosure.
Figure 2:
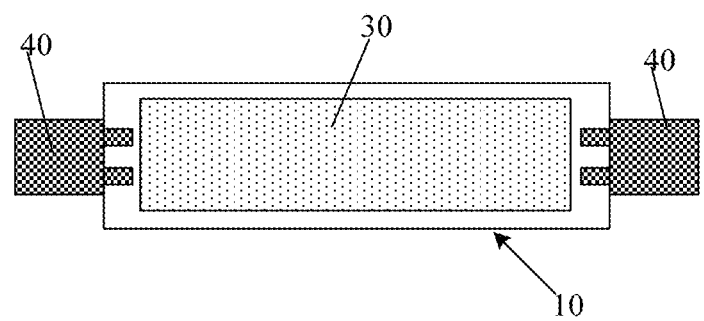
FIG. 2 is a bottom view of a structure of a light-emitting diode according to an embodiment of the present disclosure.
Figure 3:
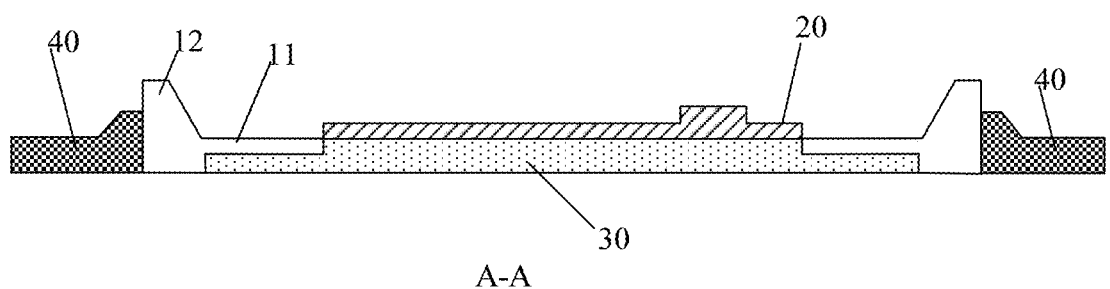
FIG. 3 is a cross-sectional view of the structure of the light-emitting diode in FIG. 1 taken along line AA.
Figure 4:
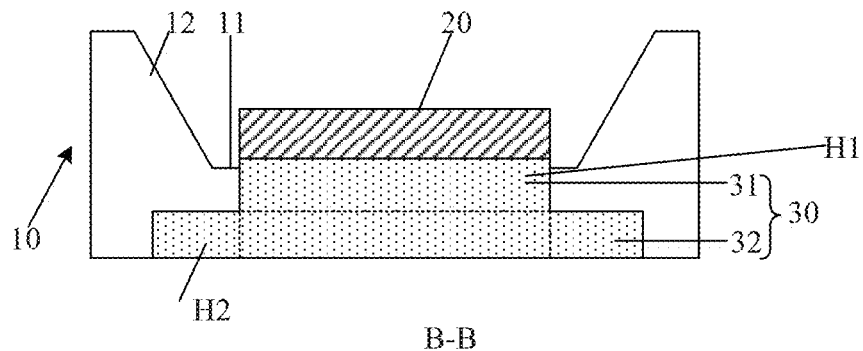
FIG. 4 is a cross-sectional view of the structure of the light-emitting diode in FIG. 1 taken along line BB.

FIG. 1 is a top view of a structure of a light-emitting diode according to an embodiment of the present disclosure. FIG. 2 is a bottom view of a structure of a light-emitting diode according to an embodiment of the present disclosure. FIG. 3 is a cross-sectional view of the structure of the light-emitting diode in FIG. 1 taken along line AA. FIG. 4 is a cross-sectional view of the structure of the light-emitting diode in FIG. 1 taken along line BB. As shown in FIG. 1 and FIG. 2, the light-emitting diode includes a support 10, a light-emitting chip 20 disposed on the support 10, and a die bonding structure 30. The support 10 includes a bottom wall 11. The light-emitting chip 20 is attached to the bottom wall 11 through the die bonding structure 30. A through hole H1 is disposed in the bottom wall 11, and a recess portion H2 is further disposed in the bottom wall 11. The recess portion H2 is located on a side of the through hole H1 and is in communication with the through hole H1. A cross-sectional area of the recess portion H2 is larger than a cross-sectional area of the through hole H1. An orthographic projection of the recess portion H2 on the bottom wall 11 completely covers and exceeds an orthographic projection of the through hole H1 on the bottom wall 11. The die bonding structure 30 is located (filled) in both the through hole H1 and the recess portion H2. The light-emitting chip 20 (i.e., the P-N junction) is used for converting light energy into electrical energy. The die bonding structure 30 may be of a colloid structure. On one hand, the light-emitting chip 20 may be attached to the support 10 through the die bonding structure 30, and on the other hand, a part of heat generated by the light-emitting chip 20 can be absorbed by the die bonding structure 30.

In the related art, the die bonding structure is generally a layer structure disposed between the light-emitting chip and the support, and opposite surfaces of the die bonding structure are covered by the light-emitting chip and the support, respectively. Generally, the support is made of plastic or ceramic, so effect of the heat dissipation of the support is poor, and the heat dissipation of the die bonding structure is hindered. In the light-emitting diode according to the present disclosure, the die bonding structure 30 is located in the through hole H1 and the recess portion H2 in the bottom wall 11 of the support 10 and is not covered by the support 10, which is beneficial for the die bonding structure 30 to directly dissipate heat to the external environment, thereby realizing heat dissipation. In addition, it not required to add other structures to the light-emitting diode does, therefore no additional process is required, and the production cost is lower. In summary, in the present disclosure, good heat dissipation can be realized without increasing production complexity.

In order to further improve the effect of the heat dissipation, the die bonding structure 30 may be made of silver paste or metal grease.

As shown in FIG. 1 to FIG. 4, the support 10 includes the bottom wall 11 and a sidewall 12 coupled to edges of the bottom wall 11. The sidewall 12 surrounds the light-emitting chip 20. The die bonding structure 30 includes a first die bonding layer 31 and a second die bonding layer 32 coupled with each other. The first die bonding layer 31 is located in the through hole H1, and the second die bonding layer 32 is located in the recess portion H2. The light-emitting chip 20 and the second die bonding layer 32 are respectively located on both sides of the through hole H1 along a depth direction of the through hole H1. The light-emitting chip 20 is located on a surface of the first die bonding layer 31 distal to the second die bonding layer 32. The first die bonding layer 31 and the second die bonding layer 32 are made of a same material and are formed together as one piece.

In an implementation, the first die bonding layer 31 does not protrude from the through hole H1 and is at a same level as the through hole H1. In an embodiment, the first die bonding layer 31 protrudes from the through hole H1 and is at a higher level than the through hole H1. In this case, a portion of the die bonding structure protruding from the through hole H1 and distal to the second die bonding layer 32 is a third die bonding layer, which will be described later.

In an implementation, as shown in FIG. 3 and FIG. 4, an orthographic projection of the second die bonding layer 32 on the bottom wall 11 completely covers and exceeds an area where the through hole H1 is located, so as to increase a contact area of the second die bonding layer 32 with the external environment, thereby enabling the die bonding structure 30 to dissipate heat to the external environment more quickly.

Figure 9:
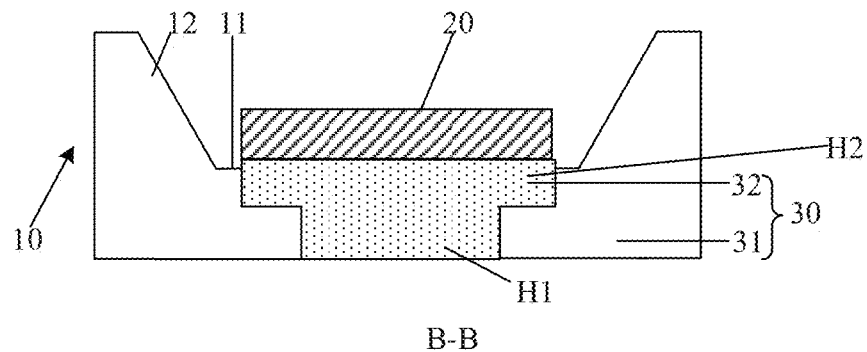
FIG. 9 is a cross-sectional view of a structure of a light-emitting diode according to an embodiment of the present disclosure.

In an implementation, as shown in FIG. 9, the recess portion H2 is located on a side of the support 10 proximal to the light-emitting chip 20, the light-emitting chip 20 may also be on a side of the recess portion H2 distal to the through hole H1. In the embodiment, the other layers are the same as those in the previous embodiment, and thus detailed description thereof is omitted.

Figure 8:
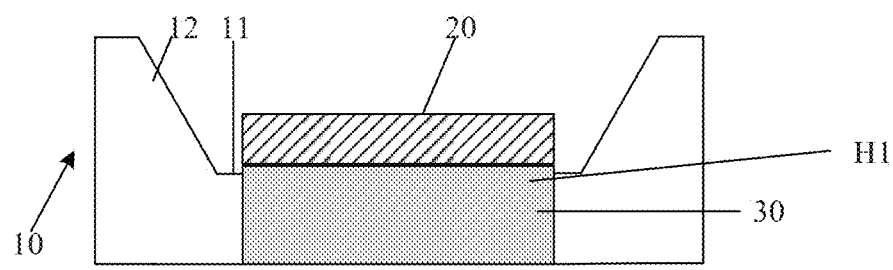
FIG. 8 is a cross-sectional view of a structure of a light-emitting diode according to an embodiment of the present disclosure.

In an implementation, as shown in FIG. 8, the support 10 includes a bottom wall 11, and the light-emitting chip 20 is attached to the bottom wall 11 through a die bonding structure 30. Only one through hole H1 is disposed in the bottom wall 11, and no recess portion is disposed in the bottom wall 11. An orthographic projection of an upper opening of the through hole H1 on the bottom wall 11 is completely overlapped with an orthographic projection of a lower opening of the through hole H1 on the bottom wall 11. The die bonding structure 30 is filled in the through hole H1. The light-emitting chip is located on a side of the die bonding structure 30, and the sidewall 12 of the support 10 surrounds the light-emitting chip 20.

As shown in FIG. 1 to FIG. 3, the light-emitting chip 20 further includes two pins 40. The two pins 40 are respectively coupled to positive and negative electrodes of the light-emitting chip 20 through leads inside the support 10.

Figure 5:
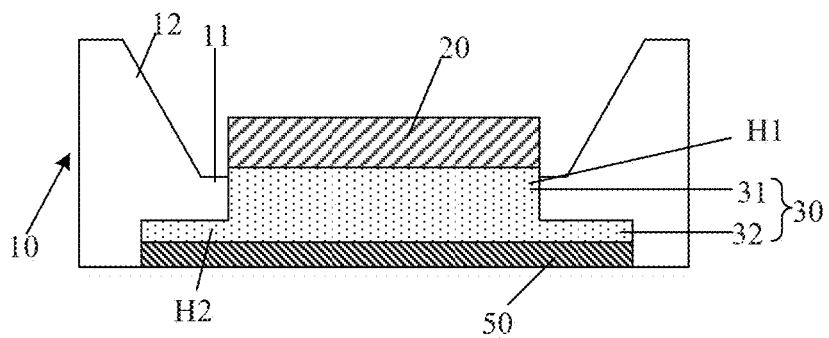
FIG. 5 is a cross-sectional view of a structure of a light-emitting diode according to an embodiment of the present disclosure.

FIG. 5 is a cross-sectional view of a structure of a light-emitting diode in FIG. 1, taken along line BB, according to an embodiment of the present disclosure. The die bonding structure 30 includes a first die bonding layer 31 and a second die bonding layer 32. The first die bonding layer 31 is located in the through hole H1 in the bottom wall 11, and the second die bonding layer 32 is located in the recess portion H2. The orthographic projection of the second die bonding layer 32 on the bottom wall 11 exceeds the area where the through hole H1 is located. Differences between two structures of the light-emitting diode will be described below.

As shown in FIG. 5, according to the embodiment of the present disclosure, the light-emitting diode further includes a heat dissipation layer 50 which is in contact with the second die bonding layer 32. The heat dissipation layer 50 is located in the recess portion H2. The heat dissipation layer 50 may be made of a material with high thermal conductivity, such as thermally conductive silica gel, silicon wafer, graphite, ceramic, and the like. Although the die bonding structure 30 is not in direct contact with the external environment, due to good thermal conduction of the heat dissipation layer 50, the heat of the die bonding structure 30 can be dissipated to the external environment rapidly. As shown in FIG. 5, an orthographic projection of the heat dissipation layer 50 on the bottom wall 11 coincides with an orthographic projection of the second die bonding layer 32 on the bottom wall 11.

Figure 6:
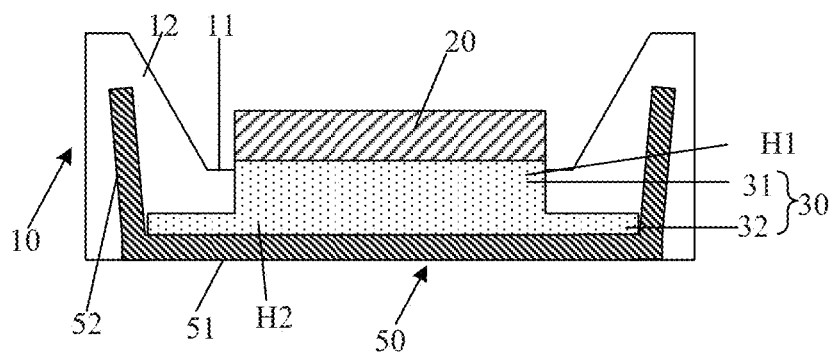
FIG. 6 is a cross-sectional view of a structure of a light-emitting diode according to an embodiment of the present disclosure.

FIG. 6 is a cross-sectional view of a structure of a light-emitting diode in FIG. 1, taken along line BB, according to an embodiment of the present disclosure. A difference between the light-emitting diode in the present embodiment and the light-emitting diode in the previous embodiment only is that the structures of the heat dissipation layer 50 are different. As shown in FIG. 6, the heat dissipation layer 50 includes a first heat dissipation portion 51 and a second heat dissipation portion 52 which are coupled to each other. The first heat dissipation portion 51 is located on a surface of the second die bonding layer 32 distal to the first die bonding layer 31, and the second heat dissipation portion 52 is inside the sidewall 12 of the support 10. An orthographic projection of the first heat dissipation portion 51 on the bottom wall 11 coincides with an orthographic projection of the second die bonding layer 32 on the bottom wall 11. Compared with the heat dissipation layer 50 in FIG. 5, the heat dissipation layer 50 in FIG. 6 has a larger heat dissipation area, which is beneficial to improve the heat dissipation effect of the light-emitting diode.

Second heat dissipation portions 52 may be disposed respectively on both sides of the first heat dissipation portion 51 along a width direction of the light-emitting diode. Alternatively, the second heat dissipation portions 52 may be disposed respectively on both sides of the first heat dissipation portion 51 along a length direction of the light-emitting diode. The second heat dissipation portions 52 may be disposed respectively on both sides of the first heat dissipation portion 51 along the width direction of the light-emitting diode and on both sides of the first heat dissipation portion 51 along the length direction of the light-emitting diode, thereby increasing the heat dissipation area, and improving the heat dissipation effect. The first heat dissipation portion 51 and the second heat dissipation portion 52 are made of a same material and formed together as one piece.

The heat dissipation layer 50 may also be applied to the embodiments shown in FIG. 8 or FIG. 9.

Figure 7A:
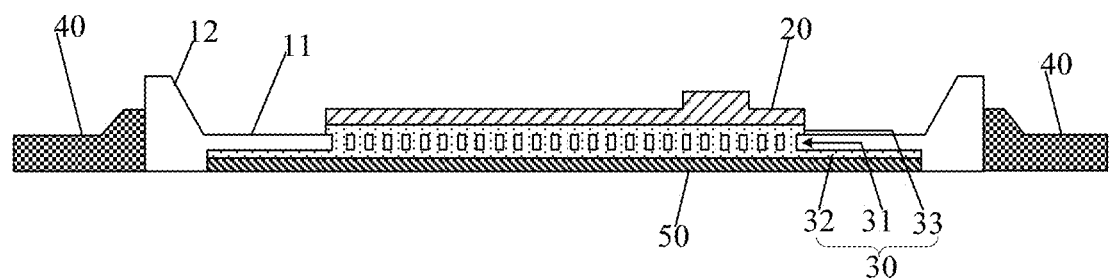
FIG. 7a is a cross-sectional view of a structure of a light-emitting diode according to an embodiment of the present disclosure.
Figure 7B:
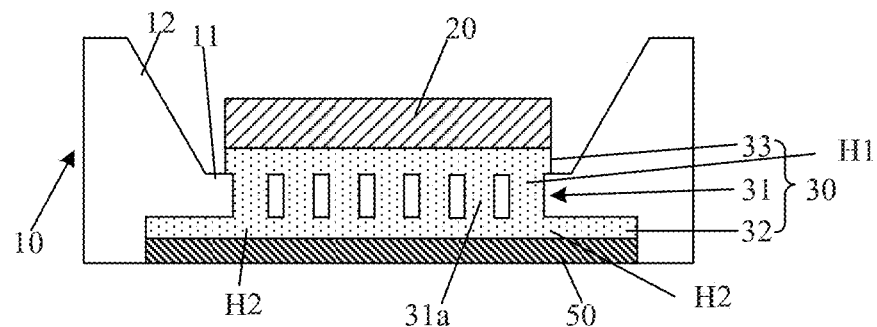
FIG. 7b is a cross-sectional view of a structure of a light-emitting diode according to an embodiment of the present disclosure.

FIG. 7a is a cross-sectional view of a structure of a light-emitting diode in FIG. 1, taken along line AA, according to an embodiment of the present disclosure. FIG. 7b is a cross-sectional view of the structure of the light-emitting diode in FIG. 1, taken along line BB, according to an embodiment of the present disclosure. Since the structure of the light-emitting diode in the present embodiment is similar to that in the previous embodiment, only the difference in structure between the two light-emitting diodes will be described below.

As shown in FIGS. 7a and 7b, according to the embodiment of the present disclosure, the light-emitting diode includes a screen-type support 10. In the screen-type support 10, a plurality of through holes H1 and a recess portion H2 communicating with the plurality of through holes H1 are disposed in the bottom wall 11 of the support 10. The plurality of through holes H1 may be arranged in an array.

The first die bonding layer 31 is located in the plurality of through holes H of the bottom wall 11, and the second die bonding layer 32 is located in the recess portion H2. An orthographic projection of the second die bonding layer 32 on the bottom wall 11 exceeds an area where the plurality of through holes H1 are located.

The die bonding structure 30 further includes a third die bonding layer 33 outside the plurality of through holes H1 and protruding from the plurality of through holes H1. The third die bonding layer 33 and the second die bonding layer 32 are respectively on both sides of the plurality of through holes H1 along a depth direction of the plurality of through holes H1. The light-emitting chip 20 is formed on a surface of the third die bonding layer 33 distal to the first die bonding layer 31. The first die bonding layer 31, the second die bonding layer 32 and the third die bonding layer 33 are made of a same material and formed as a whole.

The first die bonding layer 31 includes a plurality of die bonding portions 31a. The plurality of die bonding portions 31a are disposed in the plurality of through holes H1 in a one-to-one correspondence manner. The first die bonding layer 31 is formed in the plurality of through holes H1, and a portion of the first die bonding layer 31 formed in each of the through holes H1 is formed as one die bonding portion 31a. By providing the plurality of through holes H1 and the plurality of die bonding portions 31, the light-emitting chip 20 can be fixed more stably on the bottom wall 11.

In addition, according to the embodiment of the present disclosure, the light-emitting diode may further include the heat dissipation layer 50 which has the same structure as that of the heat dissipation layer 50 in FIG. 5. Alternatively, the heat dissipation layer 50 may have the same structure as that of the heat dissipation layer 50 in FIG. 6. Alternatively, the light-emitting diode shown in FIG. 7b may have no heat dissipation layer 50.

Figure 10:
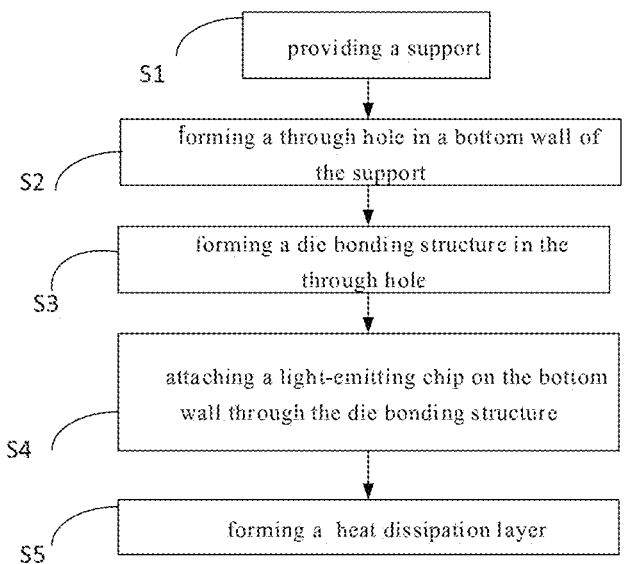
FIG. 10 is a flow chart of a method for manufacturing a light-emitting diode according to an embodiment of the present disclosure.

FIG. 10 is a flow chart of a method for manufacturing a light-emitting diode according to an embodiment of the present disclosure. As shown in FIG. 8 and FIG. 10, the method for manufacturing the light-emitting diode may include the following steps S1 to S5.

At step S1, a support having a bottom wall is provided.

At step S2, a through hole is formed on the bottom wall.

At step S3, a die bonding structure is formed in the through hole.

At step S4, a light-emitting chip is attached onto the bottom wall through the die bonding structure.

In a case where a recess portion H2 in communication with the through hole H1 is formed in the bottom wall 11 of the support 10, the step S3 further includes: a die bonding material is filled in the through hole H1 and the recess portion H2, such that a first die bonding layer 31 is formed in the through hole H1, and a second die bonding layer 32 is formed in the recess portion H2.

At step S4, the light-emitting chip 20 may be provided on any side of the bottom wall 11 of the support 10. In an implementation, as shown in FIG. 4, the light-emitting chip 20 may be provided on a side of the bottom wall 11 proximal to the through hole H1. For example, the light-emitting chip 20 may be formed on a surface of the first die bonding layer 31 distal to the second die bonding layer 32. In an implementation, as shown in FIG. 9, the light-emitting chip 20 may be provided on a side of the bottom wall 11 proximal to the recess portion H2. For example, the light-emitting chip 20 may be provided on a surface of the second die bonding layer 32 distal to the first die bonding layer 31.

In a case where a plurality of through holes are formed, step S3 may further include: a third die bonding layer is formed on the first die bonding layer, such that the third die bonding layer and the second die bonding layer are respectively located on two sides of the first die bonding layer. In this case, the first die bonding layer may include a plurality of die bonding portions formed in a plurality of through holes in a one-to-one correspondence manner. In this case, the light-emitting chip may be formed on a surface of the third die bonding layer distal to the first die bonding layer. The first die bonding layer, the second die bonding layer and the third die bonding layer are made of a same material and formed together as one piece.

At step S5, the heat dissipation layer 50 is formed such that the heat dissipation layer 50 is in contact with a surface of the second die bonding layer 32 distal to the light-emitting chip 20.

The heat dissipation layer 50 is in contact with the second die bonding layer 32. The heat dissipation layer 50 is formed in the recess portions H2. The heat dissipation layer 50 may be made of a material with high thermal conductivity, such as thermally conductive silica gel, silicon wafer, graphite, ceramic, and the like.

In an implementation, the heat dissipation layer 50 includes a first heat dissipation portion 51 and a second heat dissipation portion 52 which are connected with each other. The first heat dissipation portion 51 is formed on a surface of the second die bonding layer 32 distal to the first die bonding layer 31, and the second die bonding layer 32 is formed inside the sidewall 12 of the support 10. An orthographic projection of the first heat dissipation portion 51 on the bottom wall 11 coincides with an orthographic projection of the second die bonding layer 32 on the bottom wall 11. Compared with the heat dissipation layer 50 in FIG. 5, the heat dissipation layer 50 in FIG. 6 has a larger heat dissipation area, which is beneficial to improve the heat dissipation effect of the light-emitting diode.

In an implementation, the second heat dissipation portions 52 may be formed on both sides of the first heat dissipation portion 51 along a width direction of the light-emitting diode, respectively. In an implementation, the second heat dissipation portions 52 may be formed at both sides of the first heat dissipation portion 51 along a length direction of the light-emitting diode, respectively. In an implementation, the second heat dissipation portions 52 may be formed respectively on both sides of the first heat dissipation portion 51 along the width direction of the light-emitting diode and on both sides of the first heat dissipation portion 51 along the length direction of the light-emitting diode, thereby increasing the heat dissipation area, and improving the heat dissipation effect. The first heat dissipation portion 51 and the second heat dissipation portion 52 are made of a same material and are formed together as one piece.

A backlight source is provided in the present disclosure, which includes a light bar, and optical films such as a light guide plate and a prism sheet. The light bar includes a plurality of light-emitting diodes each of which is the light-emitting diode described above. Since the light-emitting diode can realize heat dissipation without increasing the production complexity, the backlight source can realize heat dissipation without increasing the production complexity, thereby prolonging the service life of the backlight source, and improving the luminous intensity of the backlight source without increasing the production cost.

A display device is provided in the present disclosure, which includes a display panel and the backlight source described above. The display device can be any product with a display function, such as a mobile phone, a tablet computer, a television, a display, a notebook computer, a digital photo frame, a navigator and the like. Since the backlight source can realize heat dissipation without increasing the production complexity, the display device can realize heat dissipation without increasing the production complexity, thereby prolonging the service life of the display device, and improving the display effect of the display device without increasing the production cost.

It should be understood that the above embodiments are merely exemplary embodiments for the purpose of illustrating the principle of the present disclosure. However, the present disclosure is not limited thereto. It will be apparent to those skilled in the art that various changes and modifications can be made without departing from the spirit and essence of the present disclosure, and the changes and modifications should be regarded as falling within the scope of the present disclosure.

What is claimed is:

1. A light-emitting diode, comprising a support having a bottom wall, a light-emitting chip on the support, and a die bonding structure, wherein
the bottom wall has at least one through hole therein;
the die bonding structure is in the at least one through hole; and
the light-emitting chip is attached to the bottom wall through the die bonding structure, wherein
the bottom wall has a recess portion on a side thereof distal to the light-emitting chip, the recess portion is in communication with the through hole;
the die bonding structure comprises a first die bonding layer and a second die bonding layer;
the first die bonding layer is in the through hole;
the second die bonding layer is in the recess portion;
the die bonding structure further comprises a third die bonding layer on a surface of the first die bonding layer distal to the second die bonding layer;
the light-emitting chip is on a surface of the third die bonding layer distal to the first die bonding layer;
the at least one through hole comprises a plurality of through holes;
the first die bonding layer comprises a plurality of die bonding portions; and
the plurality of die bonding portions are in the plurality of through holes in a one-to-one correspondence manner.

2. The light-emitting diode according to claim 1, wherein an orthographic projection of the recess portion on the bottom wall covers and exceeds an orthographic projection of the through hole on the bottom wall.

3. The light-emitting diode according to claim 1, wherein the light-emitting chip is on a surface of the first die bonding layer distal to the second die bonding layer.

4. The light-emitting diode according to claim 1, wherein the first die bonding layer, the second die bonding layer and the third die bonding layer are made of a same material and formed together as one piece.

5. The light-emitting diode according to claim 1, wherein the light-emitting diode further comprises a heat dissipation layer in contact with a surface of the die bonding structure distal to the light-emitting chip.

6. The light-emitting diode according to claim 5, wherein the support further comprises a sidewall connected with an edge of the bottom wall and surrounding the light-emitting chip; and
the heat dissipation layer comprises a first heat dissipation portion on a surface of the second die bonding layer distal to the first die bonding layer, and a second heat dissipation portion inside the sidewall of the support.

7. The light-emitting diode according to claim 5, wherein the heat dissipation layer comprises any one selected from metal, heat dissipation silica gel, silicon chip, graphite and ceramic.

8. A backlight source, comprising a light-emitting diode, wherein the light-emitting diode is the light-emitting diode according to claim 1.

9. A display device, comprising a backlight source, wherein the backlight source is the backlight source according to claim 8.

10. A method for manufacturing a light-emitting diode, comprising:
providing a support having a bottom wall;
forming at least one through hole in the bottom wall;
forming a die bonding structure in the at least one through hole;
attaching a light-emitting chip on the bottom wall through the die bonding structure,
forming a recess portion, which is in communication with the through hole, on a side of the bottom wall distal to the light-emitting chip, wherein
the forming a die bonding structure in the at least one through hole comprises: forming a first die bonding layer of the die bonding structure in the through hole; and forming a second die bonding layer of the die bonding structure in the recess portion,
forming a die bonding structure in the at least one through hole further comprises: forming a third die bonding layer on a surface of the first die bonding layer distal to the second die bonding layer; and the attaching a light-emitting chip on the bottom wall through the die bonding structure further comprises: providing the light-emitting chip on a surface of the third die bonding layer distal to the first die bonding layer, and wherein
the at least one through hole comprises a plurality of through holes;
the first die bonding layer comprises a plurality of die bonding portions; and
the forming at least a portion of a die bonding structure in the at least one through hole further comprises: forming the plurality of die bonding portions in the plurality of through holes in a one-to-one correspondence manner.

11. The method according to claim 10, wherein
forming a recess portion on a side of the bottom wall distal to the light-emitting chip further comprises: forming the recess portion such that an orthographic projection of the recess portion on the bottom wall covers and exceeds an orthographic projection of the through hole on the bottom wall.

12. The method according to claim 10, wherein
the attaching a light-emitting chip on the bottom wall through the die bonding structure further comprises: forming the light-emitting chip on a surface of the first die bonding layer distal to the second die bonding layer.

13. The method according to claim 10, wherein
the first die bonding layer, the second die bonding layer and the third die bonding layer are made of a same material and formed together as one piece.

14. The method according to claim 10, further comprising: forming a heat dissipation layer in contact with a surface of the second die bonding layer distal to the light-emitting chip.

* * * * *